United States Patent
Park et al.

(10) Patent No.: US 10,510,881 B2
(45) Date of Patent: Dec. 17, 2019

(54) METHOD OF PRODUCING A SYMMETRIC LDMOS TRANSISTOR

(71) Applicant: ams AG, Unterpremstaetten (AT)

(72) Inventors: Jong Mun Park, Graz (AT); Georg Roehrer, Lebring (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/640,232

(22) Filed: Jun. 30, 2017

(65) Prior Publication Data

US 2017/0301790 A1  Oct. 19, 2017

Related U.S. Application Data

(62) Division of application No. 13/808,574, filed as application No. PCT/EP2011/058854 on May 30, 2011, now Pat. No. 9,698,257.

(30) Foreign Application Priority Data

Jul. 5, 2010 (EP) .................................. 10006920

(51) Int. Cl.
*H01L 29/78* (2006.01)
*H01L 29/08* (2006.01)
(Continued)

(52) U.S. Cl.
CPC ...... *H01L 29/7816* (2013.01); *H01L 29/0865* (2013.01); *H01L 29/0869* (2013.01);
(Continued)

(58) Field of Classification Search
CPC . H01L 21/04; H01L 29/0653; H01L 29/0692; H01L 29/0865; H01L 29/0869;
(Continued)

(56) References Cited

U.S. PATENT DOCUMENTS 4,714,519 A   12/1987 Pfiester
6,359,298 B1   3/2002 Krishnan
(Continued)

FOREIGN PATENT DOCUMENTS

WO   WO-2002/09184 A2   1/2002

OTHER PUBLICATIONS

Macary, V. et al., "A Novel LDMOS structure with high negative voltage capability for reverse battery protection in automotive IC's", BIPOLAR/BICMOS Circuits and Technology Meeting, 2000: Proceedings of the 2000, Sep. 24-26, 2000, Piscataway, NJ, USA, IEEE, Sep. 24, 2000, pp. 90-93.

*Primary Examiner* — Marcos D. Pizarro
(74) *Attorney, Agent, or Firm* — Fish & Richardson P.C.

(57) ABSTRACT

A well of a first type of conductivity is formed in a semiconductor substrate, and wells of a second type of conductivity are formed in the well of the first type of conductivity at a distance from one another. By an implantation of dopants, a doped region of the second type of conductivity is formed in the well of the first type of conductivity between the wells of the second type of conductivity and at a distance from the wells of the second type of conductivity. Source/drain contacts are applied to the wells of the second type of conductivity, and a gate dielectric and a gate electrode are arranged above regions of the well of the first type of conductivity that are located between the wells of the second type of conductivity and the doped region of the second type of conductivity.

3 Claims, 7 Drawing Sheets

(51) Int. Cl.
*H01L 29/66* (2006.01)
*H01L 29/423* (2006.01)
*H01L 29/10* (2006.01)
*H01L 29/49* (2006.01)
*H01L 29/06* (2006.01)

(52) U.S. Cl.
CPC ...... *H01L 29/0882* (2013.01); *H01L 29/0886* (2013.01); *H01L 29/1033* (2013.01); *H01L 29/1045* (2013.01); *H01L 29/4238* (2013.01); *H01L 29/4983* (2013.01); *H01L 29/66484* (2013.01); *H01L 29/66537* (2013.01); *H01L 29/66568* (2013.01); *H01L 29/66681* (2013.01); *H01L 29/7831* (2013.01); *H01L 29/7836* (2013.01); *H01L 29/0649* (2013.01); *H01L 29/0653* (2013.01); *H01L 29/0692* (2013.01)

(58) Field of Classification Search
CPC ............. H01L 29/0882; H01L 29/0886; H01L 29/1045; H01L 29/4238; H01L 29/66681; H01L 29/7816
See application file for complete search history.

(56) References Cited

U.S. PATENT DOCUMENTS

| | | | |
|---|---|---|---|
| 7,910,441 | B2 | 3/2011 | Yang et al. |
| 7,910,991 | B2 | 3/2011 | Yang et al. |
| 8,063,443 | B2 | 11/2011 | Cai |
| 8,410,557 | B2 | 4/2013 | Yoneda et al. |
| 2007/0212838 | A1 | 9/2007 | Ivanov et al. |
| 2008/0121997 | A1 | 5/2008 | Yang et al. |
| 2009/0256200 | A1 | 10/2009 | Yao et al. |
| 2010/0327343 | A1* | 12/2010 | Salcedo .................. H01L 24/05 257/328 |
| 2011/0115019 | A1 | 5/2011 | Giles et al. |

\* cited by examiner

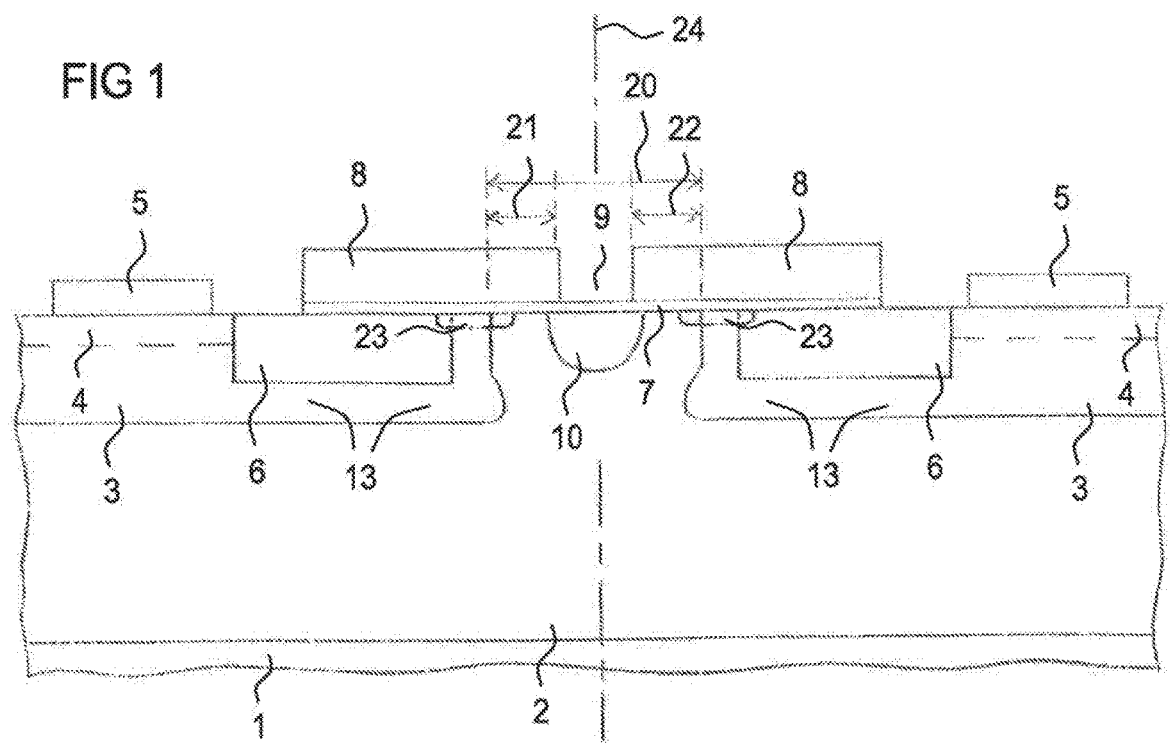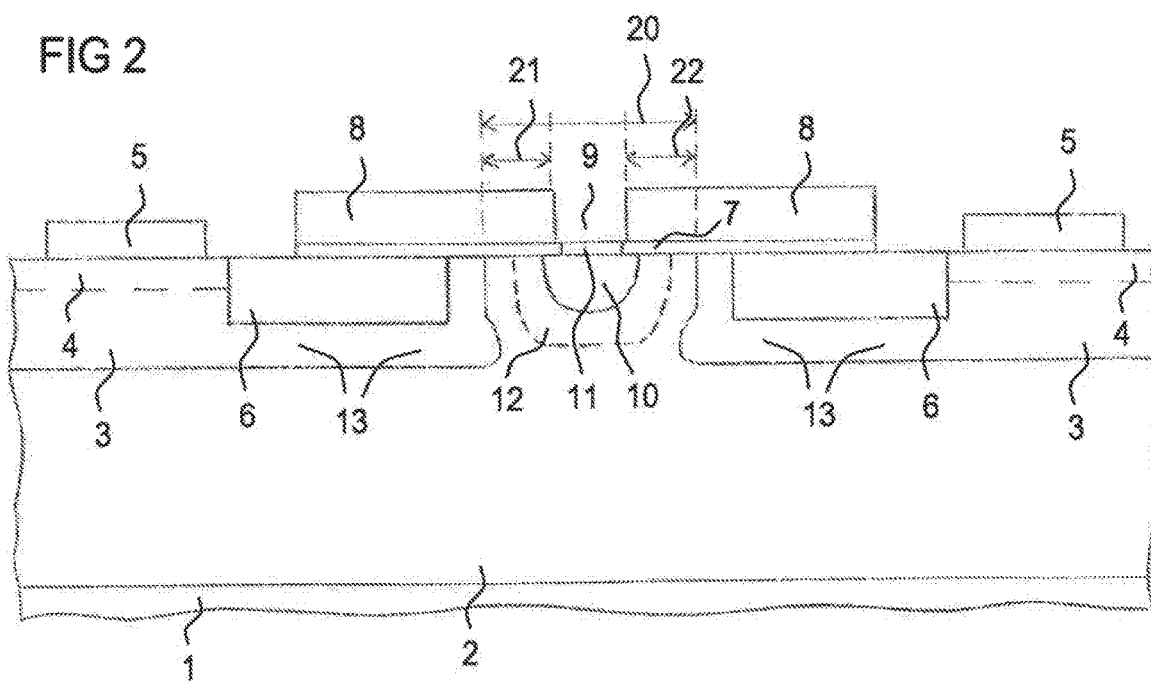

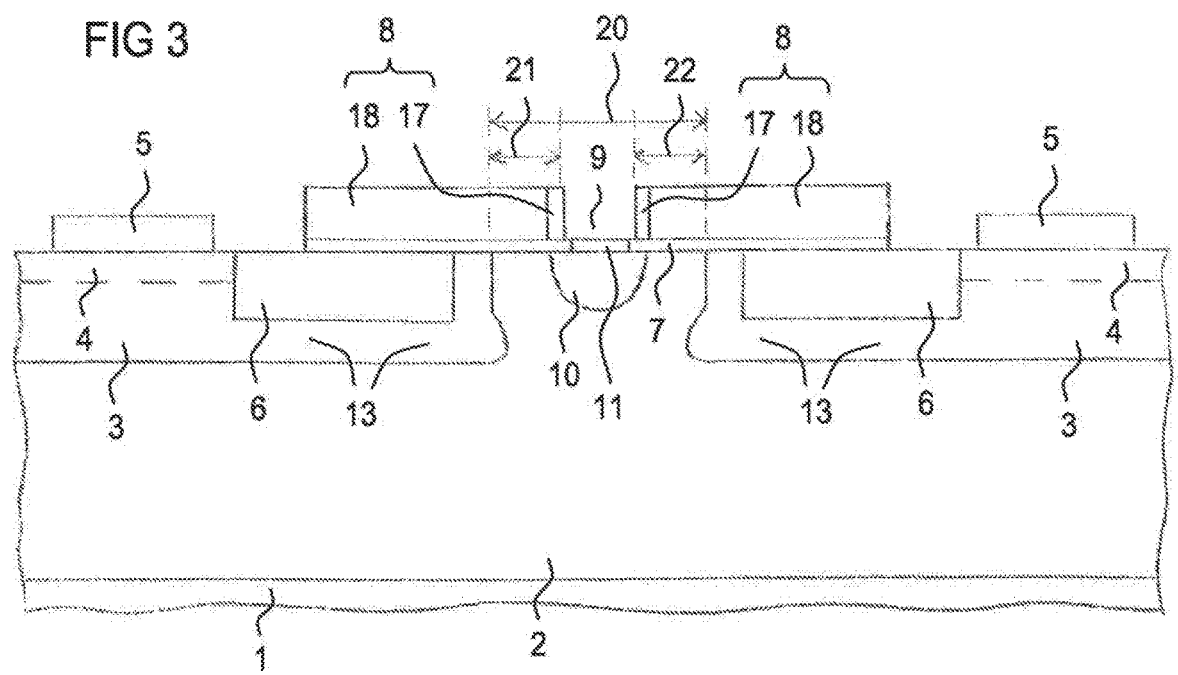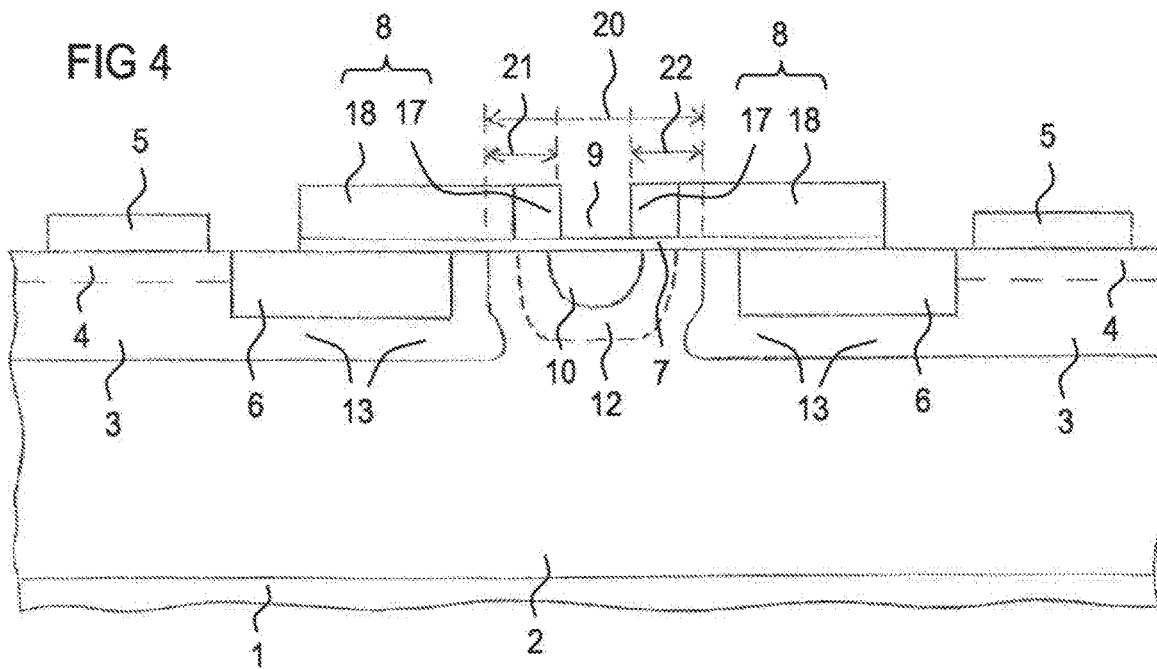

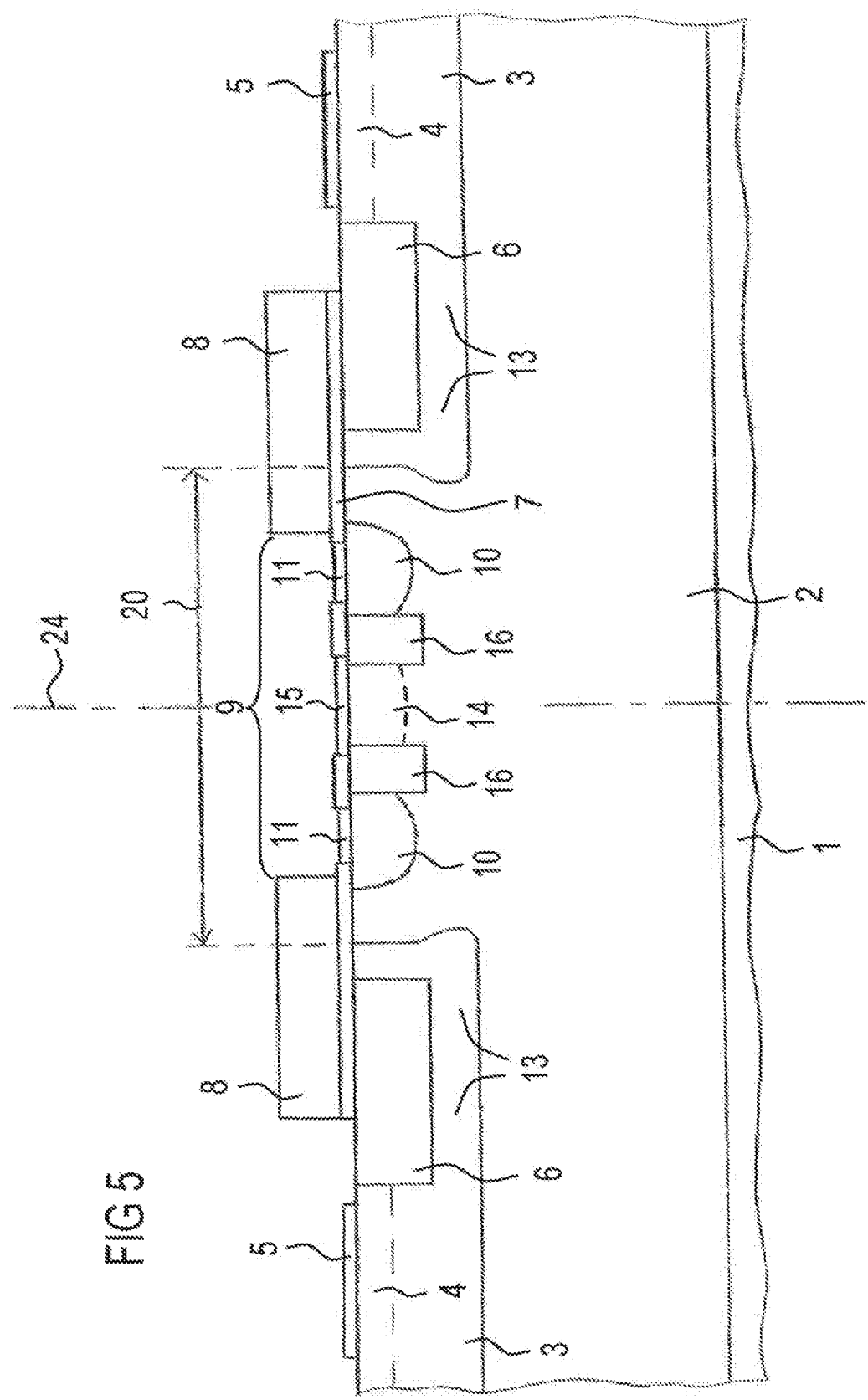

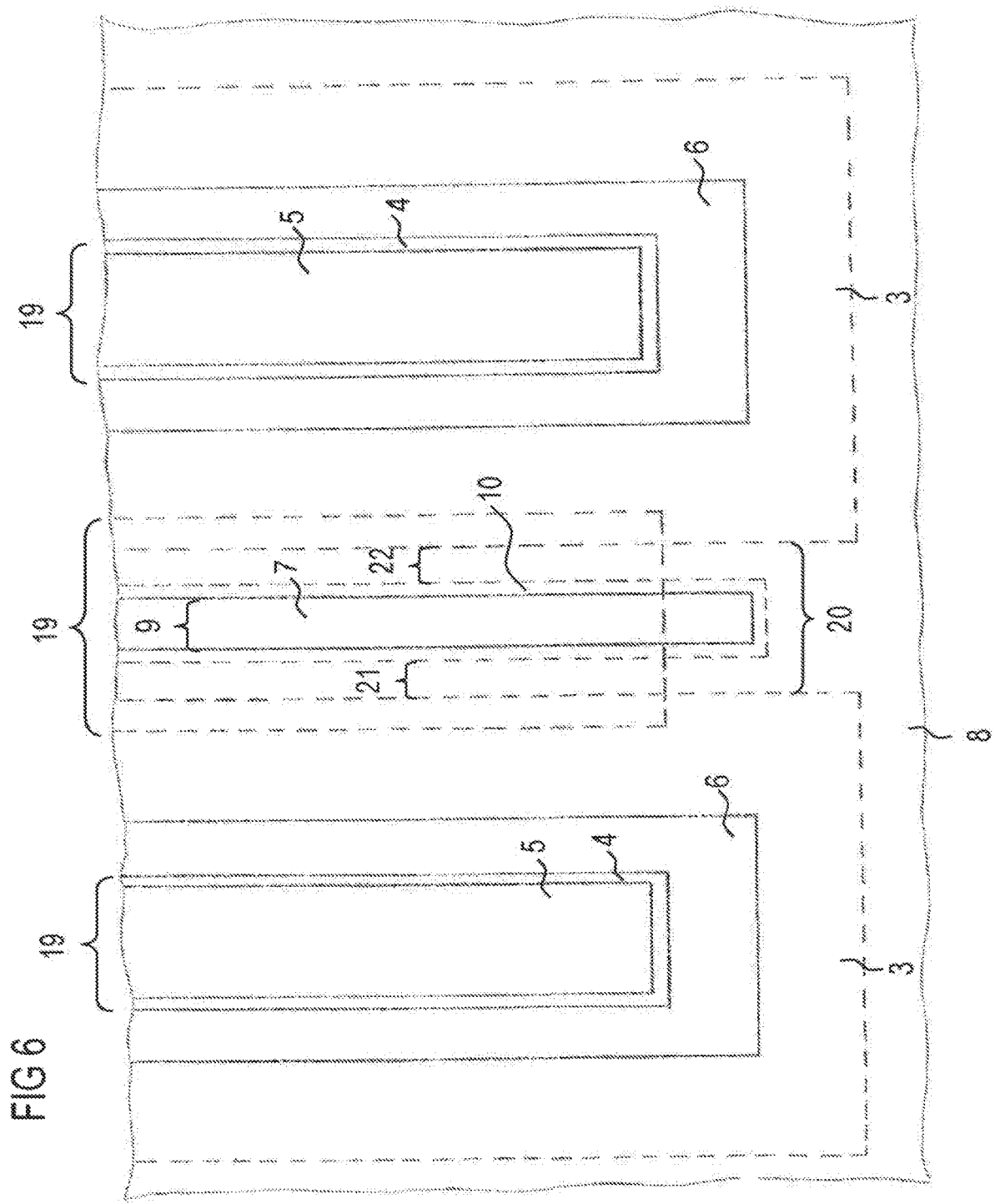

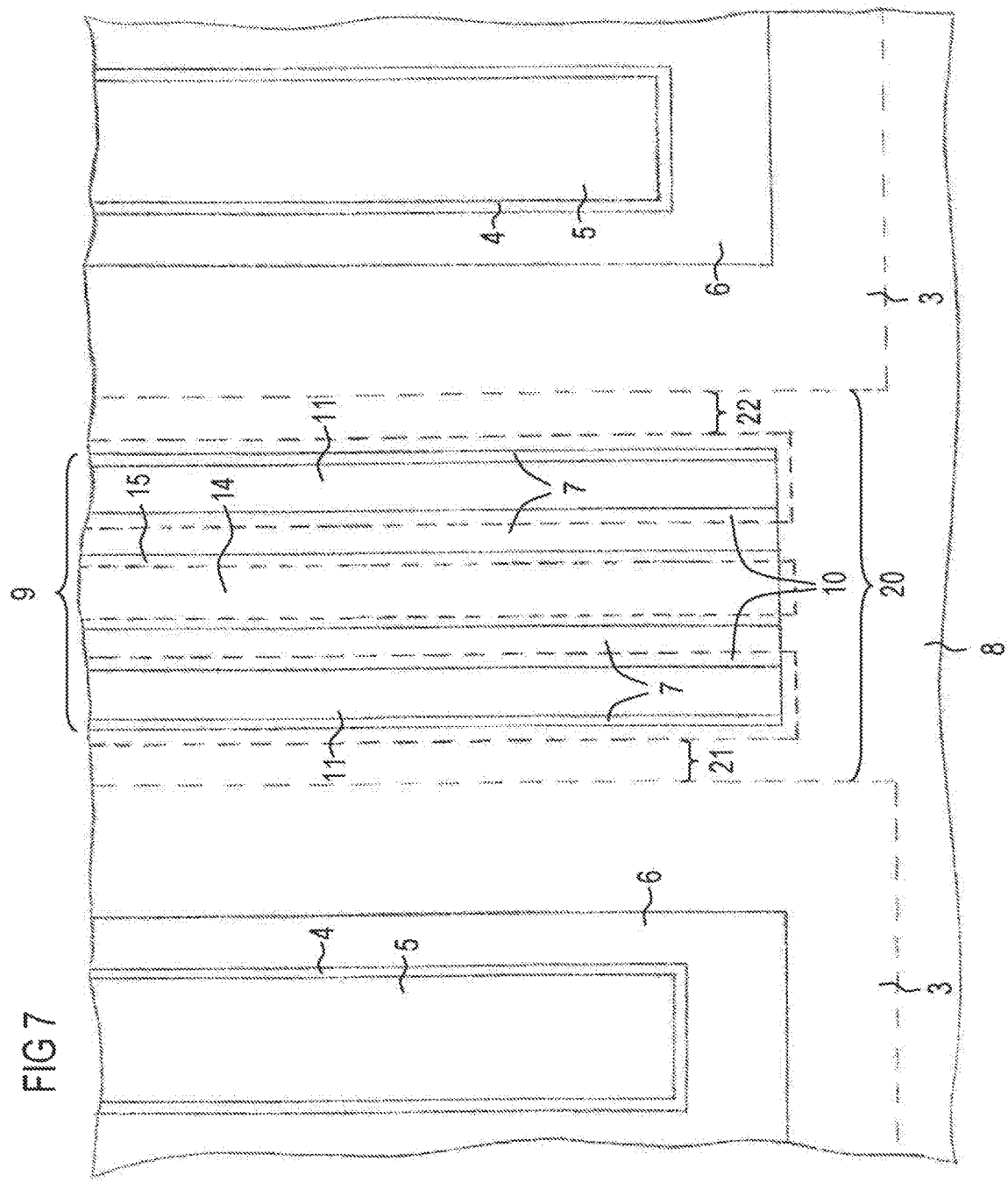

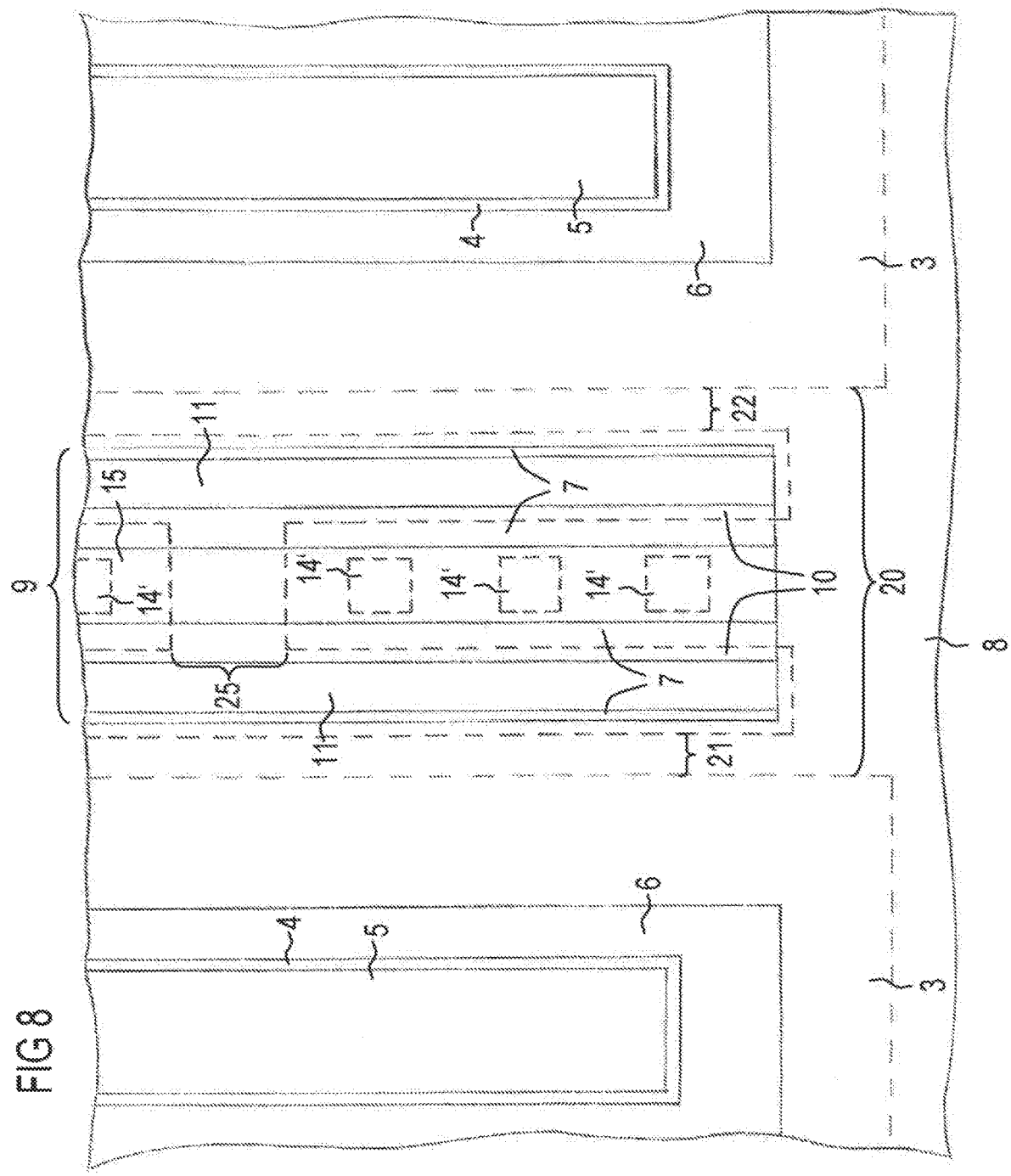

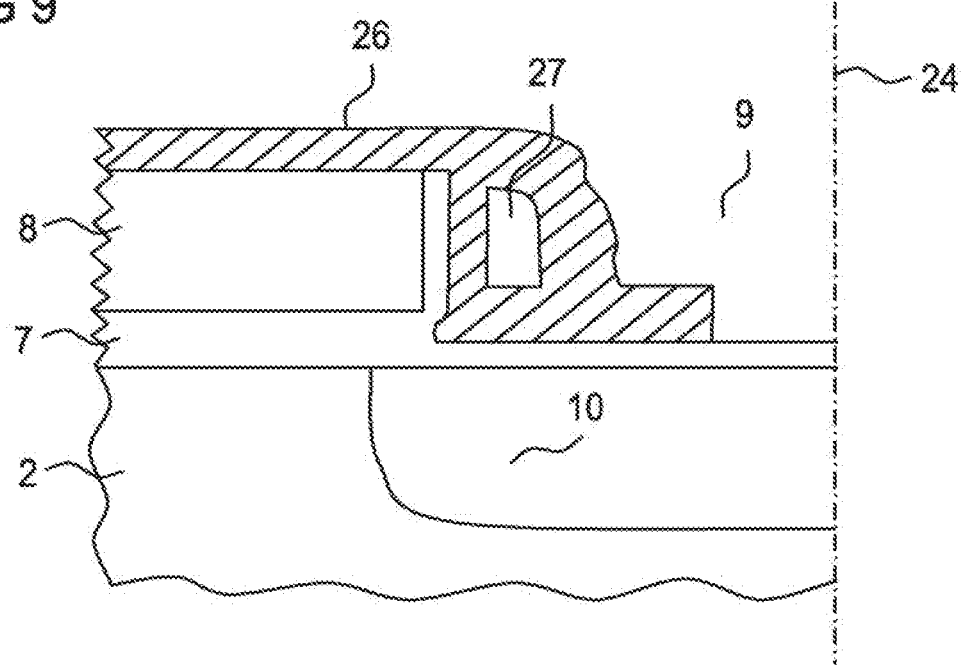
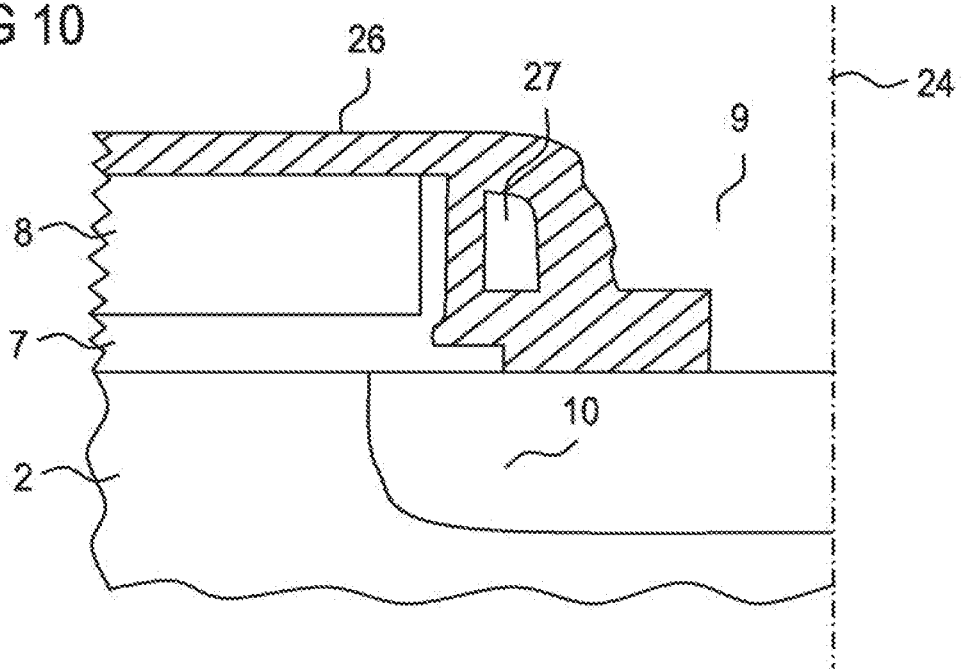

METHOD OF PRODUCING A SYMMETRIC LDMOS TRANSISTOR

CROSS-REFERENCE TO RELATED APPLICATIONS

The present application is a divisional of U.S. patent application Ser. No. 13/808,574 filed Mar. 20, 2013, which is the national stage of International Application No. PCT/EP2011/58854, filed on May 30, 2011, which claims the benefit of priority of European Patent Application No. 10006920.2, filed on Jul. 5, 2010, all of which are hereby incorporated by reference in their entirety for all purposes.

BACKGROUND OF THE INVENTION

Symmetric high-voltage p-channel LDMOS transistors show a high on-resistance compared to that of asymmetric p-channel LDMOS transistors. This is mainly due to the large cell-pitch and the large channel-length of the device. In general, the punch-through behavior between two p-drift regions is the limiting factor regarding a reduction of the channel-length.

Furthermore, a low threshold voltage of symmetric high-voltage p-channel transistors is desired and achieved by a relatively low doping concentration of the body well. The low doping concentration between the two p-drift regions increases the danger of a punch-through. Therefore, the minimal channel-length of the symmetric p-channel LDMOS transistor is typically much larger than that of an asymmetric p-channel LDMOS transistor.

If the body-well doping is not to be increased, a reduction of the channel-length is only possible by a reduction of the depth of the p-well defining the p-drift region or by an implantation of a relatively low dose of p-dopants forming a lightly doped drain. These methods are avoided because they are not in accordance with the conventional production processes or require dedicated process steps.

SUMMARY OF THE INVENTION

The method of producing a symmetric LDMOS transistor comprises the steps of forming a well of a first type of conductivity in a semiconductor substrate and forming wells of an opposite second type of conductivity in the well of the first type of conductivity, so that the wells of the second type of conductivity are arranged at a distance from one another. An implantation of dopants is performed, whereby a doped region of the second type of conductivity is produced in the well of the first type of conductivity. The doped region of the second type of conductivity is arranged between the wells of the second type of conductivity at a distance from the wells of the second type of conductivity. Source/drain contacts are applied to the wells of the second type of conductivity. A gate dielectric and a gate electrode are arranged above regions of the well of the first type of conductivity that are located between the wells of the second type of conductivity and the doped region of the second type of conductivity. The gate electrode is provided with a gap above the doped region of the second type of conductivity.

In a variant of the method, the implantation of dopants, whereby the doped region of the second type of conductivity is produced, is also used to produce source/drain regions in the wells of the second type of conductivity. The source/drain regions are thus more highly doped than the wells of the second type of conductivity. There may be standard LDD implantations together with the formation of the doped region of the second type of conductivity.

The gate electrode may be formed to have a conductive region of the first type of conductivity, and the implantation of dopants may also be provided for the formation of a conductive region of the second type of conductivity of the gate electrode adjacent to the gap.

A further variant of the method comprises an implantation of a shallow well of the first type of conductivity in the well of the first type of conductivity, and the doped region of the second type of conductivity is arranged in the shallow well.

A further variant of the method comprises an implantation of dopants forming a body contact region, which is connected with the well of the first type of conductivity and arranged between areas of the doped region of the second type of conductivity. A body contact is applied to the body contact region.

The following is a detailed description of examples of the method of production in conjunction with the appended figures.

BRIEF DESCRIPTION OF THE DRAWINGS

FIG. 1 shows a cross-section of a symmetric LDMOS transistor.

FIG. 2 shows a cross-section of a further symmetric LDMOS transistor comprising an additional shallow well and comprising a silicide or metal region on the doped region that is located between sections of the channel region.

FIG. 3 shows a cross-section of a further symmetric LDMOS transistor comprising a silicide or metal region on the doped region that is located between sections of the channel region and comprising a gate electrode having n-conductive and p-conductive regions.

FIG. 4 shows a cross-section of a further symmetric LDMOS transistor comprising an additional shallow well and comprising a gate electrode having n-conductive and p-conductive regions.

FIG. 5 shows a cross-section of a further symmetric LDMOS transistor comprising a body contact region between areas of the doped region that is located between sections of the channel region.

FIG. 6 shows a plan view of the symmetric LDMOS transistor according to FIG. 1.

FIG. 7 shows a plan view of the symmetric LDMOS transistor according to FIG. 5.

FIG. 8 shows a plan view of a further symmetric LDMOS transistor according to FIG. 5.

FIG. 9 shows a detail of the cross-section according to FIG. 1.

FIG. 10 shows the detail according to FIG. 9 for a further symmetric LDMOS transistor.

DETAILED DESCRIPTION

FIG. 1 shows a cross-section of a symmetric high-voltage LDMOS transistor. The first type of conductivity may be n-type or p-type, whence the opposite second type of conductivity is p-type or n-type, respectively. To be specific, a p-channel LDMOS transistor is described in the following, but the same description applies to n-channel LDMOS transistors if the types of conductivities are exchanged throughout.

A semiconductor substrate 1, which may be p-conducting, is provided with an n-well 2. This is preferably a deep n-doped well. Two p-wells 3 are arranged in the n-well 2 at a distance from one another. The p-wells 3 are provided for source and drain and comprise drift regions 13. The distance between the p-wells 3 essentially defines the maximal channel-length 20 of the transistor. Source/drain regions 4 are arranged in the p-wells 3 at an upper surface of the substrate 1. The source/drain regions 4 have a higher doping concentration than the p-wells 3 and are provided with source/drain contacts 5 forming source/drain terminals.

Isolation regions 6 are arranged at the surface of the substrate 1 adjacent to the source/drain regions 4 in the direction towards the channel region. The isolation regions 6 have a smaller depth than the p-wells 3 and may be shallow trench isolations (STI), for example. The portions of the p-wells 3 that are located under the isolation regions 6 form the drift regions 13. The region of the n-well 2 between the p-wells 3 is provided as channel region. In sections of the p-wells 3 that are adjacent to the channel region, LDD implants 23 may be provided to form lightly doped drain regions. But it is not necessary to have LDD implants 23, because the doping concentration in this region can be controlled by the design of the p-well 3.

A p-doped region 10 is arranged in the n-well 2 at the location of the channel. The p-doped region 10 is arranged between the p-wells 3 at a distance 21, 22 from the p-wells 3. The regions between the p-doped region 10 and the p-wells 3 each form a section of the channel, so that the sum of the distances 21, 22 corresponds to the effective channel length.

The channel region is covered with a gate dielectric 7, on which the gate electrode 8 is arranged. The gate electrode 8 has a gap 9 above the p-doped region 10. The position of the plane 24 of symmetry is indicated in the cross-section of FIG. 1.

The channel region of the transistor according to FIG. 1 is split into two sections, each located between the p-doped region 10 and one of the p-wells 3. The overall effective channel length can thus be adjusted by the dimension of the p-doped region 10.

FIG. 2 shows a cross-section of a further symmetric LDMOS transistor comprising two additional features, which are independent of each other. Like elements are designated with the same reference numerals as in FIG. 1. The symmetric LDMOS transistor according to FIG. 2 is provided with a shallow n-well 12 within the deep n-well 2. The p-doped region 10 is arranged in the shallow n-well 12. By means of the shallow n-well 12, the doping concentration of the n-well 2 is preferably increased in the region around the p-doped region 10. The shallow n-well 12 thus further inhibits the occurrence of a punch-through.

FIG. 2 shows a further feature, which is independent of the presence of the shallow n-well 12. This further feature relates to a silicide or a metal region 11 interrupting the layer of the gate dielectric 7 in the area of the gap 9 of the gate electrode 8. The silicide or metal region 11 forms an electric conductor parallel to the p-doped region 10 and thus reduces the resistance between the sections of the channel essentially. In this way, the on-resistance of the transistor can be essentially reduced.

FIG. 3 shows a cross-section of a further symmetric LDMOS transistor, wherein the gate electrode 8 comprises a p-conductive region 17 adjacent to the gap 9 and an n-conductive region 18. The gate electrode 8 may be polysilicon, which may be provided with a basic n-conductivity. When the p-doped region 10 is formed by an implantation of p-dopants, the polysilicon gate electrode 8 can be used as a mask. The regions of the gate electrode 8 that are adjacent to the gap 9 are also doped with p-dopants and thus the p-conductive region 17 is formed. On each side of the gap 9 the length of the p-conductive region 17 should be shorter than the distance 21, 22 between the p-doped region 10 and the p-well 3. The n-conductive region 18 and the doping concentration of the n-well 2 and the additional shallow n-well 12, if provided, together determine the threshold voltage. In the symmetric LDMOS transistor according to FIG. 3, a silicide or metal region 11 may also be provided on the p-doped region 10, similar to the embodiment of FIG. 2.

FIG. 4 shows a cross-section of a further symmetric LDMOS transistor, which comprises another combination of the additional features of the symmetric LDMOS transistors according to FIGS. 2, 3 and 4. The symmetric LDMOS transistor according to FIG. 4 is provided with a shallow n-well 12. In this example, there is no silicide or metal region 11 above the p-doped region 10, but this additional feature may be provided in the symmetric LDMOS transistor of FIG. 4 as well. The gate electrode 8 comprises a p-conductive region 17 and an n-conductive region 18. The length of the p-conductive region 17 is here larger than the length of the p-conductive region 17 of the symmetric LDMOS transistor according to FIG. 3. The length of the p-conductive region 17 can be adjusted by the implantation mask used to form the p-doped region 10. FIG. 4 illustrates how the additional features that were described in conjunction with FIGS. 2 to 4 can be combined in different ways according to the requirements of individual symmetric LDMOS transistors.

FIG. 5 shows a cross-section of a further symmetric LDMOS transistor, in which there is a body contact region 14 arranged at the centre between areas of the p-doped region 10. The p-doped region 10 and the body contact region 14 may be separated from one another by an additional isolation region 16. A connection between the sections of the p-doped region 10 is favorable and can be achieved by an external connection via a metallization belonging to a wiring or by an interconnecting p-doped region within the semiconductor material. The p-doped region 10 may be provided with a silicide or metal region 11 applied on the surface of the semiconductor material. The body contact region 14 may be provided with a body contact 15, which may be a metal, for example. The silicide or metal region 11 and the body contact 15 are separated by portions of the gate dielectric 7. In this embodiment, a pnp latch-up is suppressed. Furthermore, the area occupied by the device is reduced, because there is no need to place a body contact on the n-well 2 outside the active area of the transistor.

FIG. 6 shows a plan view of the symmetric LDMOS transistor according to FIG. 1. A major portion of the surface of the substrate 1 is occupied by the gate electrode 8. FIG. 6 shows the gap 9 above the p-doped region 10 between sections of the channel. In the gap 9 the gate dielectric 7 is not covered by the gate electrode 8. The effective channel length is determined by the distances 21, 22 between the p-doped region 10 and the p-wells 3. The lateral boundaries of the p-doped region 10 are shown as hidden contours with broken lines. The positions of the p-wells 3 are also shown with broken lines indicating the lateral boundaries of the p-wells 3, which are arranged at a distance 20 from one another. The source/drain regions 4 are shown to carry source/drain contacts 5. FIG. 6 also shows the locations of the active region 19.

FIG. 7 shows a plan view of a symmetric LDMOS transistor according to FIG. 5. The p-doped region 10 is formed by two strips of doped semiconductor material. In this symmetric LDMOS transistor the body contact region 14 is formed as a strip region between the strips of the p-doped region 10. The p-doped region 10 and the body contact region are preferably separated from one another by isolation regions 16 (cf. FIG. 5), which may be shallow trench isolations, for example. The hidden contours of the p-doped region 10 and the body contact region 14 are represented with broken lines. FIG. 7 also shows the positions of the gate dielectric 7, the silicide or metal region 11 on the p-doped region 10, and the body contact 15. The strips of the silicide or metal region 11 may be electrically connected via a metallization of a wiring, for instance.

FIG. 8 shows a further symmetric LDMOS transistor in a plan view according to FIG. 7. The symmetric LDMOS transistor according to FIG. 8 comprises a body contact region 14' formed by individual contact islands, which are separated from one another. The portions of the p-doped region 10 are electrically conductively connected by at least one interconnecting p-doped region 25, which is arranged between two contact islands of the body contact region 14'. The body contact 15 may be applied as a metallic strip, which is simultaneously applied to all the contact islands of the body contact region 14'.

FIG. 9 shows a detail of the cross-section of FIG. 1 encompassing a portion of the well 2 of the first type of conductivity, the gate dielectric 7, the gate electrode 8, the gap 9, and the doped region 10 of the second type of conductivity. The vertical broken line on the right indicates the plane of symmetry. The gate electrode 8 may be a polysilicon gate. There may additionally be a silicide on top of the polysilicon gate. In the example shown in FIG. 9, the gate electrode 8 is covered with a cover layer 26, which may be a nitride, for instance. The cover layer 26 may comprise an inclusion 27, which may be formed by an oxide, for instance. In the symmetric LDMOS transistor according to FIG. 9, the gate dielectric 7 is also present in the gap 9 above the doped region 10 and thus covers the whole surface area of the doped region 10. The gate dielectric 7 may instead be interrupted in the area of the gap 9 by a silicide or metal region 11 as in the symmetric LDMOS transistor according to FIG. 2.

FIG. 10 shows the detail according to FIG. 9 for another symmetric LDMOS transistor. The detail shown in FIG. 10 also encompasses a portion of the well 2 of the first type of conductivity, the gate dielectric 7, the gate electrode 8, the gap 9, and the doped region 10 of the second type of conductivity. Contrary to the symmetric LDMOS transistor according to FIG. 9, the gate dielectric 7 of the symmetric LDMOS transistor according to FIG. 10 is not present in the whole area of the gap 9, so that a major surface area of the doped region 10 is not covered with the gate dielectric 7.

The symmetric LDMOS transistor allows to reduce the minimum channel length within a standard production technology. The punch-through breakdown voltage is high and the on-resistance is low.

We claim:

1. A method of producing a symmetric LDMOS transistor, comprising:
    forming a well of a first type of conductivity in a semiconductor substrate;
    forming wells of a second type of conductivity in the well of the first type of conductivity, the wells of the second type of conductivity being arranged at a distance from one another;
    performing an implantation of dopants forming a doped region of the second type of conductivity in the well of the first type of conductivity, the doped region of the second type of conductivity being arranged between the wells of the second type of conductivity at a distance from the wells of the second type of conductivity;
    applying source/drain contacts to the wells of the second type of conductivity and arranging a gate dielectric and a gate electrode above regions of the well of the first type of conductivity that are located between the wells of the second type of conductivity and the doped region of the second type of conductivity, the gate electrode being provided with a gap above the doped region of the second type of conductivity;
    forming a body contact region between the wells of the second type of conductivity, the body contact region comprising a series of contact islands arranged on a straight line at the same distance from the wells of the second type of conductivity; and
    interconnecting separated portions of the doped region using an interconnecting doped region of the second type of conductivity, the interconnecting doped region being disposed between two contact islands of the series of contact islands.

2. The method of claim 1, further comprising:
    providing the implantation of dopants also for the formation of source/drain regions in the wells of the second type of conductivity.

3. The method of claim 1 or 2,
    wherein the body contact region is formed by an implantation of dopants, wherein the body contact region is connected with the well of the first type of conductivity; and
    wherein the method further comprises applying a body contact to the body contact region.

* * * * *